(12) United States Patent
Sohn et al.

(10) Patent No.: US 7,999,456 B2
(45) Date of Patent: Aug. 16, 2011

(54) WHITE LIGHT EMITTING DIODE WITH YELLOW, GREEN AND RED LIGHT EMITTING PHOSPHOR

(75) Inventors: Jong Rak Sohn, Suwon (KR); Chul Soo Yoon, Suwon (KR); Chang Hoon Kwak, Seoul (KR); Il Woo Park, Suwon (KR)

(73) Assignee: Samsung LED Co., Ltd., Gyunggi-Do (KR)

( * ) Notice: Subject to any disclaimer, the term of this patent is extended or adjusted under 35 U.S.C. 154(b) by 503 days.

(21) Appl. No.: 11/905,234

(22) Filed: Sep. 28, 2007

(65) Prior Publication Data
US 2008/0088226 A1 Apr. 17, 2008

(30) Foreign Application Priority Data
Oct. 17, 2006 (KR) .................. 10-2006-0100719

(51) Int. Cl.
 *H05B 33/00* (2006.01)
 *H01J 1/62* (2006.01)
 *H01L 33/00* (2010.01)
 *C09K 11/54* (2006.01)

(52) U.S. Cl. ........ 313/503; 313/487; 313/489; 313/499; 313/512; 313/486; 313/484; 313/500; 252/301.4 F

(58) Field of Classification Search ............. 252/301.4 F
See application file for complete search history.

(56) References Cited

U.S. PATENT DOCUMENTS
2005/0264173 A1* 12/2005 Wang et al. .................. 313/500
2007/0052342 A1* 3/2007 Masuda et al. ............... 313/487

FOREIGN PATENT DOCUMENTS

| | | |
|---|---|---|
| JP | 2002-531956 | 9/2002 |
| JP | 2004-127988 | 4/2004 |
| JP | 2006-049799 | 2/2006 |
| KR | 2003-0060697 A | 7/2003 |
| WO | WO 2006/077740 A1 | 7/2006 |
| WO | WO 2006/098450 A1 | 9/2006 |

OTHER PUBLICATIONS

Jia Diagndong, Enhancement of the Long Persistance by Ce-doping in CaS,eu, tm Red Phosphor, Journal of electrochemical society, 153pp H198-H200,Jun. 2005.*

Kang et al.The enhancement of photoluminescence characteristics of Eu-doped barium strontium silicate phosphor particles by co-doping materials, Journal of Alloys and Compounds,(242) Jun. 2005.pp. 246-250.*

H.L. Park et al., "Physics of Alkaline-Earth Sulfide Phosphors," Chinese Journal of Physics, Feb. 1990, vol. 28, Issue 1, p. 105.

Japanese Office Action, w/ English translation thereof, issued in Japanese Patent Application No. JP 2007-255479 dated Jul. 6, 2010.

Japanese Decision of Rejection, with English Translation, issued in Japanese Patent Application No. 2007-255479, dated Nov. 30, 2010.

* cited by examiner

*Primary Examiner* — Anne M Hines
*Assistant Examiner* — Tracie Green
(74) *Attorney, Agent, or Firm* — McDermott Will & Emery LLP

(57) ABSTRACT

Provided is a white light emitting diode (LED) including a blue LED chip; and yellow, green, and red light emitting phosphors that are coated on the blue LED chip at a predetermined mixing ratio and converts light, emitted from the blue LED chip, into white light.

5 Claims, 2 Drawing Sheets

[FIG. 1]
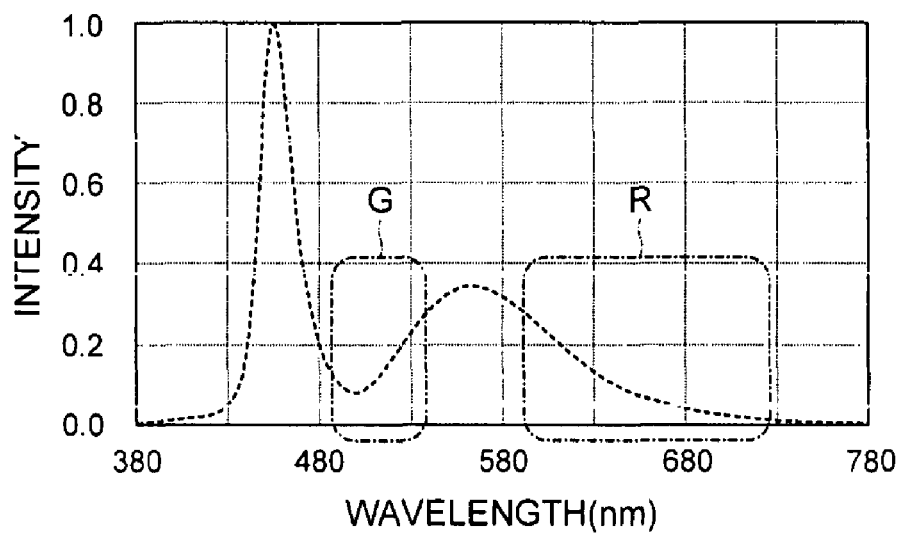
[FIG. 2]
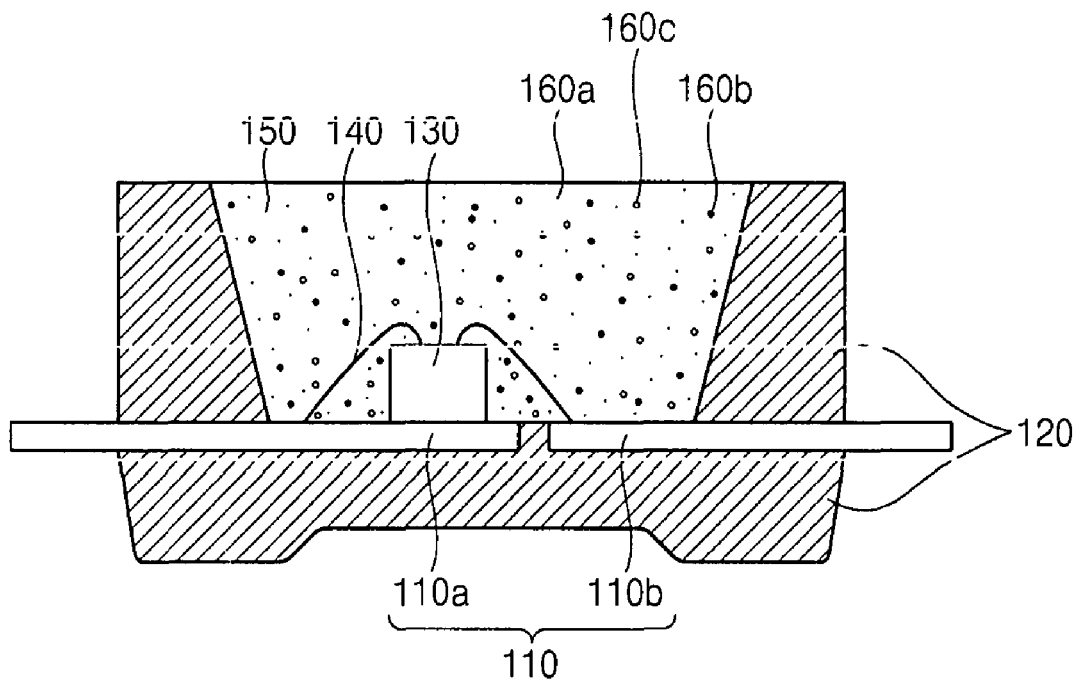

[FIG. 3]
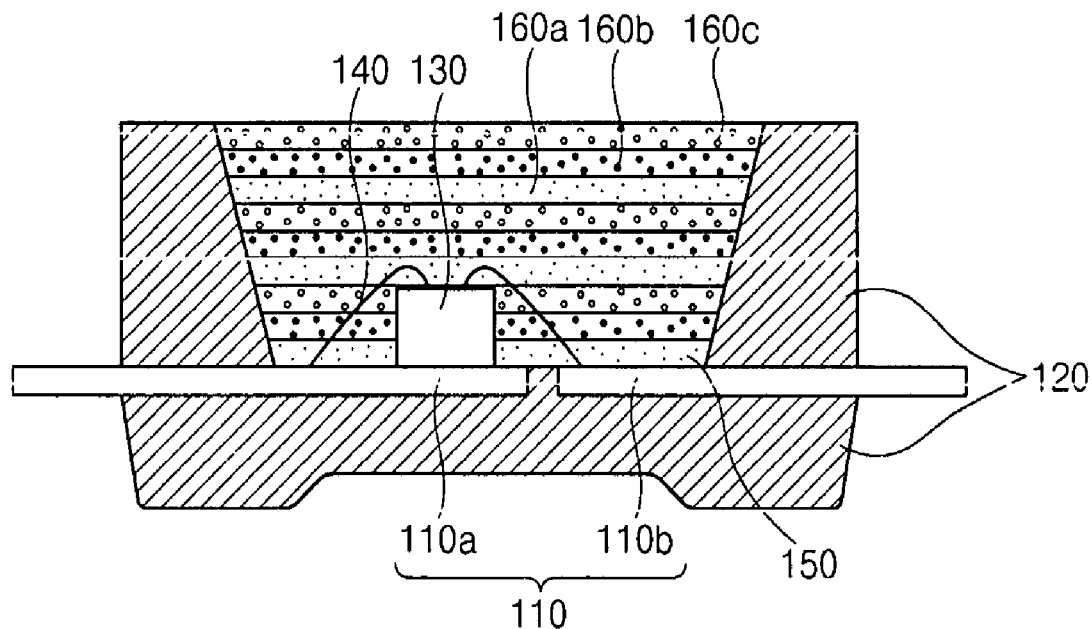
[FIG. 4]
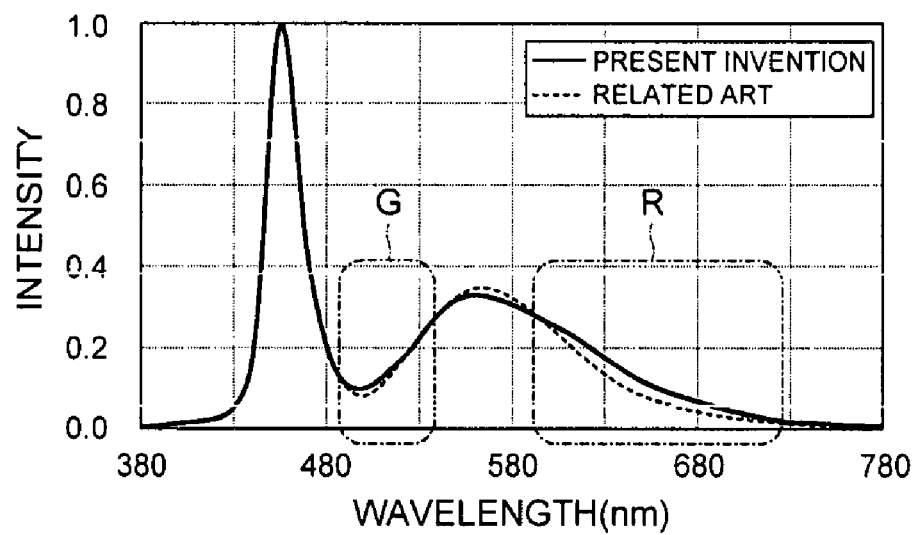

WHITE LIGHT EMITTING DIODE WITH YELLOW, GREEN AND RED LIGHT EMITTING PHOSPHOR

CROSS-REFERENCE TO RELATED APPLICATIONS

This application claims the benefit of Korean Patent Application No. 10-2006-0100719 filed with the Korean Intellectual Property Office on Oct. 17, 2006, the disclosure of which is incorporated herein by reference.

BACKGROUND OF THE INVENTION

1. Field of the Invention

The present invention relates to a white light emitting diode (LED) which is formed by additionally applying green and red light emitting phosphors to a white LED in which a blue LED chip and a yellow light emitting phosphor are combined. In the white LED, the intensities of green and red light emission regions are increased, which have been relatively low. Therefore, it is possible to provide a white LED, of which the color representation is excellent and which can satisfy a hue angle value.

2. Description of the Related Art

In general, LEDs are referred to as semiconductor devices of which the light emitting sources are constructed by changing compound semiconductor materials such as GaAs, AlGaAs, GaN, InGaInP and the like, thereby implementing various colors of light.

Recently, as the semiconductor technology rapidly develops, high-luminance and high-quality LEDs as well as general-purpose low-luminance LEDs are being manufactured. Further, as high-characteristic blue and white LEDs are implemented, the application of LEDs is expanded into displays and next-generation lighting sources.

To apply such high-efficiency LEDs to various fields, a technique is frequently used, in which yellow light emitting phosphor is coated on a blue LED chip, thereby effectively inducing white light emission.

As for a method of implementing white light, a technique is widely applied, in which garnet-based yellow light emitting phosphor is coated on a blue LED chip. Recently, researches on a white LED, in which the blue LED chip and the yellow light emitting phosphor are combined, have rapidly developed. Upon the twenty-first century, various researches for implementing white LEDs with higher efficiency are being carried out in various fields such as LED chips, packages, and phosphors. In the field of phosphors among them, a silicate-based yellow light emitting phosphor is applied for an efficiency increase in white light emission, in addition to the existing garnet-based yellow light emitting phosphor.

FIG. 1 is a graph showing the light emission spectrum of a conventional white LED in which the blue LED chip and the silicate-based yellow light emitting phosphor are applied.

In the above-described silicate-based yellow light emitting phosphor, the full width at half maximum (FWHM) of a light-emission wavelength is narrow, because of a characteristic of europium 2+ doped with an activator. Therefore, as shown in FIG. 1, the intensities of a green light emission region G and a red light emission region R are relatively low, so that color representation is degraded and a hue angle value cannot be satisfied.

SUMMARY OF THE INVENTION

An advantage of the present invention is that it provides white light emitting diode (LED) which is formed by additionally applying green and red light emitting phosphors to a white LED in which a blue LED chip and a yellow light emitting phosphor are combined. In the white LED, the intensities of green and red light emission regions are increased, which have been relatively low. Therefore, it is possible to provide a white LED, of which the color representation is excellent and which can satisfy a hue angle value.

Additional aspects and advantages of the present general inventive concept will be set forth in part in the description which follows and, in part, will be obvious from the description, or may be learned by practice of the general inventive concept.

According to an aspect of the invention, a white light emitting diode (LED) comprises a blue LED chip; and yellow, green, and red light emitting phosphors that are coated on the blue LED chip at a predetermined mixing ratio and converts light, emitted from the blue LED chip, into white light.

Preferably, the yellow light emitting phosphor is a silicate-based phosphor.

Preferably, the green light emitting phosphor is a silicate-based or sulfide-based phosphor. In this case, as for the silicate-based phosphor, $(Ba,Sr,Ca,Mg)_2SiO_4$:Eu,Re phosphor is used. As for the sulfide-based phosphor, $(Sr,Ca)Ga_2S_4$:Eu, Re phosphor is used.

Preferably, the red light emitting phosphor is a nitride-based or sulfide-based phosphor. In this case, as for the nitride-based phosphor, $(Sr,Ca,Ba)AlSiN_3$:Eu,Re phosphor is used. As for the sulfide-based phosphor, $(Sr,Ca)S$:Eu,Re phosphor is used.

Preferably, the mixing ratio of the yellow, green, and red light emitting phosphors is set in the range of: $0.5 \leq$ yellow light emitting phosphor$<1$, $0.01 \leq$ green light emitting phosphor$\leq 0.04$, and $0.01<$ red light emitting phosphor$\leq 0.1$ (here, yellow light emitting phosphor+green light emitting phosphor+red light emitting phosphor=1).

Preferably, the yellow, green, and red light emitting phosphors are mixed and scattered.

Preferably, the yellow, green, and red light emitting phosphors are sequentially laminated in the form of layer.

Preferably, the yellow, green, and red light emitting phosphors are mixed with a molding material and are then coated.

Preferably, the molding material is formed of any one selected from the group consisting of silicon, hybrid, epoxy, and polyvinyl-based resin.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which:

FIG. 1 is a graph showing the light emission spectrum of a conventional white LED in which a blue LED chip and a silicate-based yellow light emitting phosphor are applied;

FIGS. 2 and 3 are cross-sectional views of a white LED according to the invention; and FIG. 4 is a graph illustrating the light emission spectrums of the white LED according to the invention and the conventional white LED.

DETAILED DESCRIPTION OF THE PREFERRED EMBODIMENTS

Reference will now be made in detail to the embodiments of the present general inventive concept, examples of which are illustrated in the accompanying drawings, wherein like reference numerals refer to like elements throughout. The embodiments are described below in order to explain the present general inventive concept by referring to the figures.

Hereinafter, an embodiment of the invention will be described in detail with reference to the accompanying drawings.

FIGS. 2 and 3 are cross-sectional views of a white LED according to the invention.

As shown in FIG. 2, the white LED according to the invention includes a pair of lead frames 110 composed of first and second lead frames 110a and 110b, a package mold 120 which houses portions of the lead frames 110 therein and is formed so as to define a molding material filling space, a blue LED chip 130 mounted on any one of the lead frames 110 inside the package mold 120, and a bonding wire 140 for electrically connecting the lead frames 110 to the blue LED chip 130.

The package mold 120 may be formed by a pre-molding method using plastic synthetic resin materials, and the bonding wire 140 is formed of gold (Au).

In the white LED according to the invention, yellow light emitting phosphor 160a, green light emitting phosphor 160b, and red light emitting phosphor 160c, which convert light emitted from the blue LED chip 130 into white light, are coated at a predetermined mixing ratio on the blue LED chip 130 within the package mold 120.

That is, in the conventional white LED, only the yellow light emitting phosphor 160a is applied onto the blue LED chip 130. In the invention, however, the green and red light emitting phosphors 160b and 160c are additionally mixed and coated, in addition to the yellow light emitting phosphor 160a.

Among the phosphors 160a, 160b, and 160c coated on the blue LED chip 130, the yellow light emitting phosphor 160a may be composed of silicate-based phosphor, like that of the conventional white LED.

Preferably, the green light emitting phosphor 160b used in the white LED of the invention is a silicate-based or sulfide-based phosphor. In this case, it is preferable that the silicate-based phosphor for green light emission is formed of (Ba,Sr,Ca,Mg)$_2$SiO$_4$:Eu,Re phosphor, and the sulfide-based phosphor is formed of (Sr,Ca)Ga$_2$S$_4$:Eu,Re phosphor. In such phosphors, the represents basic doping, and Re (Rare earth elements) represents rare earth co-doping.

Preferably, the red light emitting phosphor 160c is a nitride-based or sulfide-based phosphor. In this case, it is preferable that the nitride-based phosphor for red light emission is formed of (Sr,Ca,Ba)AlSiN$_3$:Eu,Re phosphor and the sulfide-based phosphor is formed of (Sr,Ca)S:Eu,Re phosphor. As described above, Eu represents a basic doping, and Re (Rare earth elements) represents rare earth co-doping.

More than two kinds of the green and red light emitting phosphors 160b and 160c can be used together with the silicate-based yellow light emitting phosphor 160a.

In the white LED according to the invention, the mixing ratio of the yellow, green, and red light emitting phosphors 160a, 160b, and 160c is set in the range of: 0.5≦yellow light emitting phosphor 160a<1, 0.01≦green light emitting phosphor 160b≦0.04, and 0.01<red light emitting phosphor 160c≦0.1 (here, yellow light emitting phosphor 160a+green light emitting phosphor 160b+red light emitting phosphor 160c=1).

Here, when the proportion of the green light emitting phosphor 160b is more than or equal to 0.4 or the proportion of the red light emitting phosphor 160c is more than or equal to 0.1, white light emission efficiency can be reduced by the reduction in excitation light conversion efficiency of the phosphor with respect to the blue LED chip 130. Therefore, it is preferable that the phosphors are mixed at the above-described ratio.

Meanwhile, the yellow, green, and red light emitting phosphors 160a, 160b, and 160c may be mixed with each other and scattered, as shown in FIG. 2. Alternately, they may be sequentially laminated in the form of layers, as shown in FIG. 3.

As shown in FIGS. 2 and 3, the yellow, green, and red light emitting phosphors 160a, 160b, and 160c may be mixed with the molding material 150 and then coated. However, only the phosphors may be used without the molding material 150. At this time, when the light emitting phosphors 160a, 160b, and 160c are mixed with the molding material 150 and then coated, it is preferable that the molding material 150 is formed of any one selected from the group consisting of silicon, hybrid, epoxy, and polyvinyl-based resin.

In the invention, the green and red light emitting phosphors 160b and 160c as well as the high-efficiency silicate-based yellow light emitting phosphor 160a are additionally coated on the blue LED chip 130, in order to complement green and red light sources. Therefore, not only the intensities of green and red regions can be secured, but a hue angle value suitable for a LCD backlight unit can be satisfied.

FIG. 4 is a graph illustrating the light emission spectrums of the white LED according to the invention and the conventional white LED. In FIG. 4, a dotted line indicates the conventional white LED according to the related art in which only the silicate-based yellow light emitting phosphor is applied, and a solid line indicates the white LED according to the invention, in which the silicate-based yellow light emitting phosphor and the green and red light emitting phosphors are mixed and applied.

As shown in FIG. 4, the white LED according to the invention can increase the intensity of the green and red light emission regions G and R which is relatively low when only the silicate-based yellow light emitting phosphor is used. Therefore, it is possible to implement a high-efficiency white LED of which the color representation is excellent and which can satisfy a hue angle value.

According to the white LED of the invention, the green and red light emitting phosphors are additionally applied to the white LED in which the blue LED chip and the yellow light emitting phosphor are combined. Then, the intensity of the green and red light emission regions which is relatively low is complemented, which makes it possible to implement a high-efficiency white LED of which the color representation is excellent and which can satisfy a hue angle value.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:
1. A white light emitting diode (LED) comprising:
a blue LED chip; and
yellow, green, and red light emitting phosphors that are coated on the blue LED chip at a predetermined mixing ratio and converts light, emitted from the blue LED chip, into white light;
wherein the yellow light emitting phosphor is a silicate-based phosphor,
wherein the green light emitting phosphor is a silicate-based phosphor composed of (Ba, Sr, Ca, Mg)2SiO4: Eu, Re or a sulfide-based phosphor composed of (Sr, Ca)Ga2S4:Eu, Re wherein the red light emitting phosphor is a nitride-based phosphor composed of Sr, Ca, Ba)AlSiN:Eu, Re wherein the Eu represents a basic doping, Re represents rare earth co-doping and the mixing ratio of the yellow, green, and red light emitting phosphors is set in the range of: $0.5 \leqq$ yellow light emitting phosphors $<1$, $0.01 \leqq$ green light emitting phosphors $\leqq 0.04$, and $0.01<$ red light emitting phosphors $\leqq 0.1$ (here, yellow light emitting phosphors+green light emitting phosphors+red light emitting phosphors=1).

2. The white LED according to claim 1, wherein the yellow, green, and red light emitting phosphors are mixed and scattered.

3. The white LED according to claim 1, wherein the yellow, green, and red light emitting phosphors are sequentially laminated in the form of layer.

4. The white LED according to claim 1, wherein the yellow, green, and red light emitting phosphors are mixed with a molding material and are then coated.

5. The white LED according to claim 4, wherein the molding material is formed of any one selected from the group consisting of silicon, hybrid, epoxy, and polyvinyl-based resin.

* * * * *